United States Patent
Kim et al.

(10) Patent No.: US 7,429,504 B2
(45) Date of Patent: Sep. 30, 2008

(54) HETEROGENEOUS GROUP IV SEMICONDUCTOR SUBSTRATES, INTEGRATED CIRCUITS FORMED ON SUCH SUBSTRATES, AND RELATED METHODS

(75) Inventors: Sung-Min Kim, Incheon-si (KR); Kyoung-Hwan Yeo, Seoul (KR); In-Soo Jung, Gyeonggi-do (KR); Si-Young Choi, Gyeonggi-do (KR); Dong-Won Kim, Gyeonggi-do (KR); Yong-Hoon Son, Gyeonggi-do (KR); Young-Eun Lee, Gyeonggi-do (KR); Byeong-Chan Lee, Gyeonggi-do (KR); Jong-Wook Lee, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 206 days.

(21) Appl. No.: 11/080,737

(22) Filed: Mar. 15, 2005

(65) Prior Publication Data
US 2005/0218395 A1 Oct. 6, 2005

(30) Foreign Application Priority Data
Mar. 16, 2004 (KR) ............. 10-2004-0017665

(51) Int. Cl.
*H01L 21/764* (2006.01)
*H01L 31/0336* (2006.01)
(52) U.S. Cl. .............. 438/191; 438/411; 438/421; 438/481
(58) Field of Classification Search ........... 438/222, 438/413, 429, 481, 933
See application file for complete search history.

(56) References Cited

U.S. PATENT DOCUMENTS

| 5,308,788 | A | * | 5/1994 | Fitch et al. | ............. | 117/86 |
| 5,374,581 | A | * | 12/1994 | Ichikawa et al. | ............. | 438/459 |
| 7,081,391 | B2 | * | 7/2006 | Lee et al. | ............. | 438/282 |
| 2004/0155296 | A1 | * | 8/2004 | Kim et al. | ............. | 257/374 |

FOREIGN PATENT DOCUMENTS

| JP | 11-312825 | * | 9/1999 |
| JP | 2003-318110 | | 11/2003 |
| KR | 2001-0076906 | | 8/2001 |
| KR | 2003-0091693 | | 12/2003 |

* cited by examiner

*Primary Examiner*—Zandra Smith
*Assistant Examiner*—Pamela E Perkins
(74) *Attorney, Agent, or Firm*—Myers Bigel Sibley & Sajovec (57) ABSTRACT

Embodiments of the present invention include heterogeneous substrates, integrated circuits formed on such heterogeneous substrates, and methods of forming such substrates and integrated circuits. The heterogeneous substrates according to certain embodiments of the present invention include a first Group IV semiconductor layer (e.g., silicon), a second Group IV pattern (e.g., a silicon-germanium pattern) that includes a plurality of individual elements on the first Group IV semiconductor layer, and a third Group IV semiconductor layer (e.g., a silicon epitaxial layer) on the second Group IV pattern and on a plurality of exposed portions of the first Group IV semiconductor layer. The second Group IV pattern may be removed in embodiments of the present invention. In these and other embodiments of the present invention, the third Group IV semiconductor layer may be planarized.

16 Claims, 5 Drawing Sheets

HETEROGENEOUS GROUP IV SEMICONDUCTOR SUBSTRATES, INTEGRATED CIRCUITS FORMED ON SUCH SUBSTRATES, AND RELATED METHODS

CLAIM OF PRIORITY

This application claims priority under 35 U.S.C. § 119 from Korean Patent Application No. 2004-17665, filed on Mar. 16, 2004, the disclosure of which is incorporated herein by reference as if set forth in its entirety.

FIELD OF THE INVENTION

The present invention generally relates to semiconductor substrates and semiconductor devices and, more specifically, to heterogeneous semiconductor substrates and integrated circuits that are formed on such substrates, along with related methods of forming such substrates and integrated circuits.

BACKGROUND OF THE INVENTION

Since the transistor was invented in 1948, tremendous advancements have been achieved in the progress of solid state device technology. These advancements have been made both through the development of more and more advanced device concepts, as well as through advancements in the materials which are used to fabricate the devices. By way of example, the performance achieved by integrated circuits today is the result of, among many other things, a considerable breakthrough in the 1950's relating to methods of growing pure and single-crystal silicon.

Conventionally, single crystalline silicon substrates have been widely used in semiconductor device manufacturing processes. After the formation of the single-crystal ingot by liquid-encapsulated Czochralski growth, the ingot is mechanically processed to manufacture silicon wafers.

Today, many semiconductor devices are highly integrated. Devices having high levels of integration may achieve high speed and performance levels, and may be more economically efficient to manufacture. However, various problems can also occur as the level of integration increases and the size of individual devices decreases. For example, as the channel length of a conventional planar field effect transistor ("FET") is reduced, several potentially undesirable effects may occur including (1) a short channel effect such as a punch-through, (2) an increase in the parasitic junction capacitance between the junction region and the substrate, and (3) an increase in the leakage current of the transistor.

In efforts to reduce and/or to eliminate one or more of the above-mentioned problems, studies have been performed in which the semiconductor devices are fabricated on various different types of substrates. By way of example, many solid state devices have been formed using silicon-on-insulator or "SOI" substrates in which a silicon layer is formed on an insulating layer. The use of SOI substrates can improve the characteristics of a semiconductor device in several ways, including reduced junction leakage current, reduced short channel effect, a lower operation voltage, and increased isolation. However, the use of SOI substrates can also give rise to several disadvantages. For example, a "floating body" effect can occur in devices with SOI substrates as a result of heat generated during operation of the device or via an accumulation of hot carriers having high energy. SOI devices also may tend to have reduced reliability if the threshold voltage is changed, because a back bias is not applied in SOI devices. In addition, since SOI field effect transistor technology requires connecting two substrates, the process for fabricating SOI devices tends to be more complicated and costly as compared to device fabrication processes using conventional bulk silicon substrates.

One specialized category of semiconductor devices are micro-electromechanical systems (MEMS). MEMS technology may be used to create electric devices and machine parts which can be less than a millimeter in size. Typically, MEMS devices involve the fabrication of both electrical structures and mechanical structures on a micro scale using conventional semiconductor manufacturing techniques. A MEMS device might include, for example, various mechanical elements, actuators and electronics on a single silicon wafer.

Typically, the electronic components of a MEMS device are formed using conventional integrated circuit fabrication technology (e.g., CMOS, bipolar, BICOM processes), while the mechanical components are formed through a micromachining process that, for example is used to selectively etch part of the silicon wafer and/or to form mechanical or electromechanical elements on the substrate. With MEMS technology, all of the electrical and mechanical structures may be formed on a single silicon wafer.

SUMMARY OF THE INVENTION

Embodiments of the present invention provide a heterogeneous semiconductor substrate. The heterogeneous semiconductor substrate according to certain embodiments comprise stacked semiconductor layers. Such heterogeneous semiconductor substrates may comprise a first semiconductor layer, a second semiconductor pattern that includes a plurality of individual elements on the first semiconductor layer, and a third semiconductor layer on the second semiconductor pattern and on a plurality of exposed portions of the first semiconductor layer. The first semiconductor layer, the second semiconductor pattern, and the third semiconductor layer may be formed of elements of Group IV of the periodic table (e.g., silicon or germanium) or a crystalline compound thereof (e.g., silicon-germanium). The first and third semiconductor layers may be formed of the same material. The second semiconductor pattern may be formed of a material having one or more different electrical and/or chemical properties as compared to the first and third semiconductor layers. The uppermost surface of the stacked semiconductor layers may be flat. The third semiconductor layer may be directly on the first semiconductor layer in exposed areas between the individual elements of the second semiconductor pattern.

Pursuant to further embodiments of the present invention, integrated circuits are provided which comprise a heterogeneous substrate that includes a first Group IV semiconductor layer, a second insulating pattern that includes a plurality of individual insulating regions on the first Group IV semiconductor layer and a third Group IV semiconductor layer on the second insulating pattern and on a plurality of exposed portions of the first Group IV semiconductor layer. One or more semiconductor devices are then provided on the heterogeneous substrate to complete the integrated circuit. In certain embodiments, the first Group IV semiconductor layer comprises a single crystalline silicon substrate and the third Group IV semiconductor layer comprises a silicon epitaxial layer. The second insulating pattern may take on a variety of different shapes, such as, for example, a plurality of parallel lines or a grid of individual islands.

In certain embodiments of these integrated circuits, the upper surfaces of the first Group IV semiconductor layer, the second insulating pattern and the third Group IV semiconductor layer may comprise planaraized upper surfaces. The third Group IV semiconductor layer may be directly on the first Group IV semiconductor layer in exposed areas between the individual insulating regions of the second insulating pattern. The at least one semiconductor device may comprise a field effect transistor, and the source region and the drain region of this transistor may each overlap respective ones of the individual insulating regions of the second insulating pattern. The second insulating pattern may comprise a plurality of voids or a pattern of an insulating material Pursuant to still further embodiments of the present invention, methods of forming a heterogeneous semiconductor substrate are provided. Pursuant to these methods, a second Group IV semiconductor pattern having a planar upper surface may be formed on a planar upper surface of a first Group IV semiconductor layer. A third Group IV semiconductor layer having a planar upper surface may then be formed on the planar upper surface of the second Group IV semiconductor pattern and on the planar upper surfaces of a plurality of exposed portions of the first Group IV semiconductor layer to provide the heterogeneous semiconductor substrate.

In certain embodiments of these methods, the third Group IV semiconductor layer may be formed by growing a primary Group IV epitaxial layer on the planar upper surface of the second Group IV semiconductor pattern and on the planar upper surfaces of the plurality of exposed portions of the first Group IV semiconductor layer at a first temperature such that a surface movement of the second Group IV semiconductor pattern does not occur. Then, a secondary Group IV epitaxial layer having a planar upper surface is formed at a second temperature such that a surface movement of the primary Group IV epitaxial layer occurs. In these methods, the first temperature may be between about 300° C. and about 800° C., and the second temperature may be between about 800° C. and about 1200° C.

In other embodiments, the third Group IV semiconductor layer may be formed by growing a Group IV epitaxial layer on the planar upper surface of the second Group IV semiconductor pattern and on the planar upper surfaces of the plurality of exposed portions of the first Group IV semiconductor layer at a first temperature such that a surface movement of the second Group IV semiconductor pattern does not occur. Then the upper surface of the Group IV epitaxial layer is planarized by performing a thermal process at a second temperature such that a surface movement of the Group IV epitaxial layer occurs. In these methods, the first temperature may be is between about 300° C. and about 800° C. The second temperature may be between about 600° C. and about 1200° C. when the thermal process is performed in a hydrogen gas ambient, and between about 900° C. and 1200° C. when the thermal process is performed in an argon gas ambient. In these methods, the first Group IV semiconductor layer may be a single crystalline silicon substrate, the second Group IV semiconductor pattern may be a silicon-germanium epitaxial pattern and the third Group IV semiconductor layer may be a silicon epitaxial layer.

Pursuant to still further embodiments of the present invention, methods of forming an integrated circuit are provided. Pursuant to these methods, a second Group IV semiconductor pattern is formed on a first Group IV semiconductor layer and a third Group IV semiconductor layer is formed on the second Group IV semiconductor pattern and on a plurality of exposed portions of the first Group IV semiconductor layer to provide a heterogeneous substrate. Then, at least one semiconductor device is formed on the heterogeneous substrate. Prior to forming the at least one semiconductor device, at least portions of the second Group IV semiconductor pattern may be selectively removed to provide a plurality of voids within the heterogeneous substrate. In certain embodiments of these methods, some of the plurality of voids may be at least partially filled with an insulating material.

In the above-described methods, the third Group IV semiconductor layer may be formed by growing a primary Group IV epitaxial layer on the second Group IV semiconductor pattern and on the plurality of exposed portions of the first Group IV semiconductor layer at a first temperature such that a surface movement of the second Group IV semiconductor pattern does not occur and then forming a secondary Group IV epitaxial layer having a planar upper surface at a second temperature that is higher then the first temperature such that a surface movement of the primary Group IV epitaxial layer occurs. In other embodiments, instead of forming a secondary Group IV epitaxial layer the upper surface of the Group IV epitaxial layer may be planarized by performing a thermal process at a second temperature that is higher then the first temperature such that a surface movement of the Group IV epitaxial layer occurs. The at least one semiconductor device may comprise a field effect transistor, and the source region of this transistor may overlap a first of the plurality of voids with an insulating material and the drain region of this transistor may overlap a second of the plurality of voids with an insulating material. In embodiments of the present invention, the first and second of the plurality of voids with an insulating material may be used to control the depth of the source region and the depth of the drain region, respectively.

BRIEF DESCRIPTION OF THE DRAWINGS

The accompanying drawings, which are included to provide a further understanding of the invention and are incorporated in and constitute a part of this application, illustrate certain embodiment(s) of the invention. In the drawings.

DETAILED DESCRIPTION

Embodiments of the present invention now will be described more fully hereinafter with reference to the accompanying drawings, in which certain embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Relative terms such as "below" or "above" or "upper" or "lower" or "horizontal" or "vertical" may be used herein to describe a relationship of one element, layer or region to another element, layer or region as illustrated in the figures. It will be understood that these terms are intended to encompass different orientations of the device in addition to the orientation depicted in the figures.

Embodiments of the invention are described herein with reference to cross-section illustrations that are schematic illustrations of idealized embodiments (and intermediate structures) of the invention. The thickness of layers and regions in the drawings may be exaggerated for clarity. Additionally, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Pursuant to embodiments of the present invention, heterogeneous semiconductor substrates are provided which have a multi-layered semiconductor layer structure. The multiple layers in these heterogeneous semiconductor substrates may have different electrical and chemical properties. Various active or passive devices may then be formed on the heterogeneous semiconductor substrates.

Figure 1:
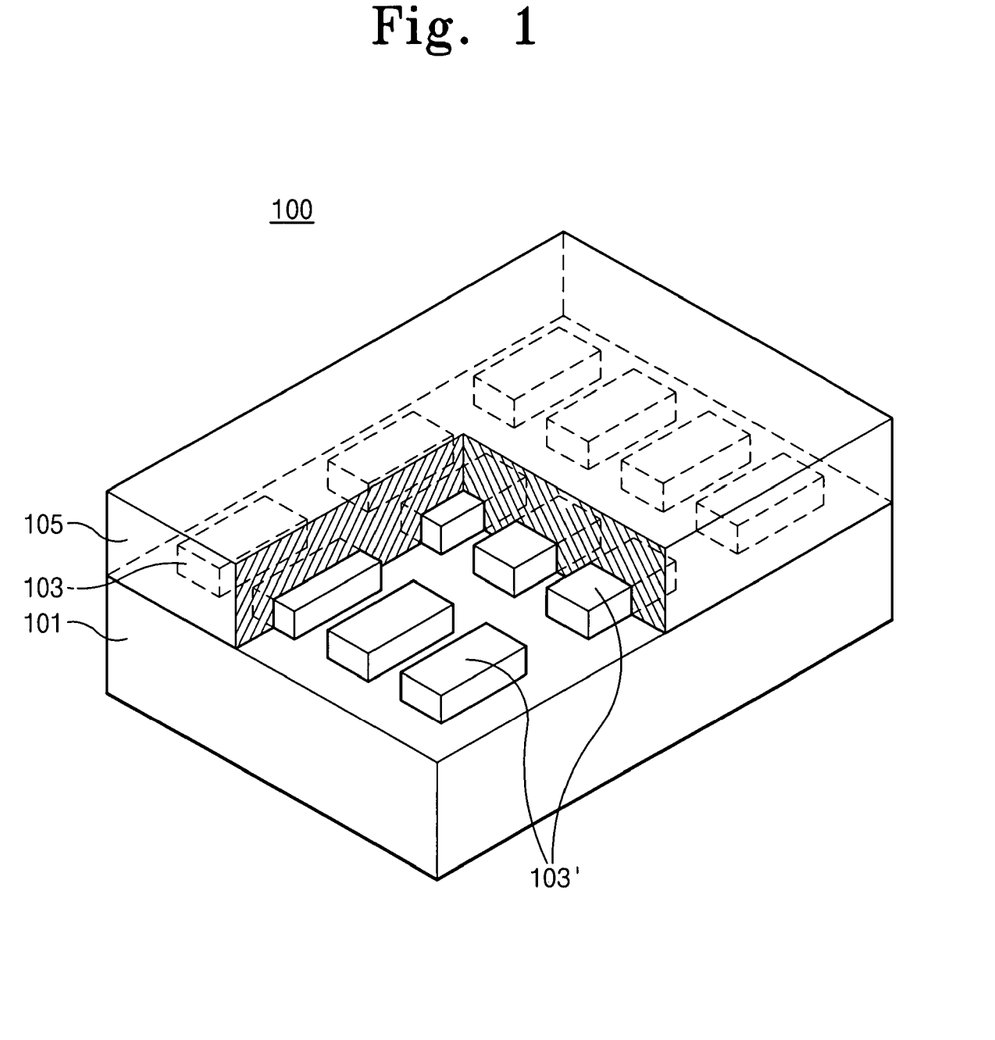
FIG. 1 is a schematic perspective view of a heterogeneous semiconductor substrate according to one embodiment of the present invention, wherein a part of the heterogeneous semiconductor substrate is removed to show its inner part.

FIG. 1 illustrates an exemplary heterogeneous semiconductor substrate according to a first embodiment of the present invention. The heterogeneous semiconductor substrates according to this first embodiment have three stacked semiconductor layers. The second of these semiconductor layers is sandwiched between the first and third semiconductor layers and comprise a semiconductor pattern that is arranged in a suitable way. The second semiconductor pattern is formed to have electrical and/or chemical properties that are different than the electrical and chemical properties of both the first and third semiconductor layers. Herein, different electrical and chemical properties include, for example, different carrier mobilities, different etch rates with respect to a specific etchant (e.g., only one layer is etched at a high etch rate, and the other layer is etched at a low rate or not at all), etc. The top surface of the heterogeneous semiconductor substrate (i.e., a top surface of the third semiconductor layer) may be formed to have a flat profile.

As shown in FIG. 1, a heterogeneous semiconductor substrate 100 according to the first embodiment of the present invention comprises a first semiconductor layer 101, a second semiconductor pattern 103 that comprises a plurality of individual elements 103', and a third semiconductor layer 105. The second semiconductor pattern 103 is formed on the first semiconductor layer 101. The third semiconductor layer 105 is formed on the first semiconductor layer so as to cover the second semiconductor pattern 103. That is, the third semiconductor layer 105 is in contact with the first semiconductor layer 101 except in the regions occupied by the individual elements 103'. In the particular embodiment of the present invention depicted in FIG. 1, the upper surface of the third semiconductor layer 105 is flat.

Although not depicted in FIG. 1, a plurality of semiconductor devices may be formed on the upper surface of the third semiconductor layer 105. For instance, a plurality of field effect transistors may be formed on the third semiconductor layer 105. In this case, the channel regions and the source/drain regions of the transistors are formed in the third semiconductor layer 105. Additionally, in other regions of the substrate 100, the second semiconductor pattern 103 may be exposed and selectively removed using, for example, conventional semiconductor device manufacturing processes. An insulating layer may then be formed in the region where the second semiconductor pattern 103 was selectively removed. In this way, the floating body effect that may occur when conventional SOI substrates are used may be reduced and/or eliminated altogether since the third semiconductor layer 105 is connected to the first semiconductor layer 101.

The first and third semiconductor layers 101, 105 and the second semiconductor pattern 103 may be formed of elements designated as Group IV in the Mendeleev periodic table, or of a crystalline compound of such elements. By way of example, the first semiconductor layer 101 may comprise a conventional bulk silicon substrate. The second semiconductor pattern 103 may, for example, comprise a silicon-germanium epitaxial pattern formed on the silicon substrate by an epitaxial growth technique. The third semiconductor layer 105 may comprise a silicon epitaxial layer, which is formed on the silicon substrate and the silicon germanium epitaxial pattern by an epitaxial growth technique. If the silicon-germanium pattern is a relaxed silicon-germanium pattern, the silicon epitaxial layer may be a strained silicon. Such a configuration may make it possible to increase carrier mobility.

Herein, references to "Group IV semiconductor layer", "Group IV semiconductor pattern" and the like refer to a semiconductor layer or pattern (or the like) that include one or more Group IV semiconductor materials. Accordingly, a silicon layer or substrate, a germanium layer or substrate, a silicon-germanium layer or substrate are all examples of "Group IV semiconductor layers" as that term is used herein.

Other heterogeneous semiconductor substrates 100 according to the first embodiment of the present invention include (1) a silicon substrate 101, a germanium pattern 103 and a silicon layer 105, (2) a silicon-germanium substrate 101, a silicon pattern 103 and a silicon-germanium layer 105, and (3) a germanium substrate 101, a silicon pattern 103 and a germanium layer 105. However, these are merely examples, and it will be appreciated that numerous additional configurations for substrate 100 fall within the embodiments of the present invention shown in FIG. 1.

Figure 2:
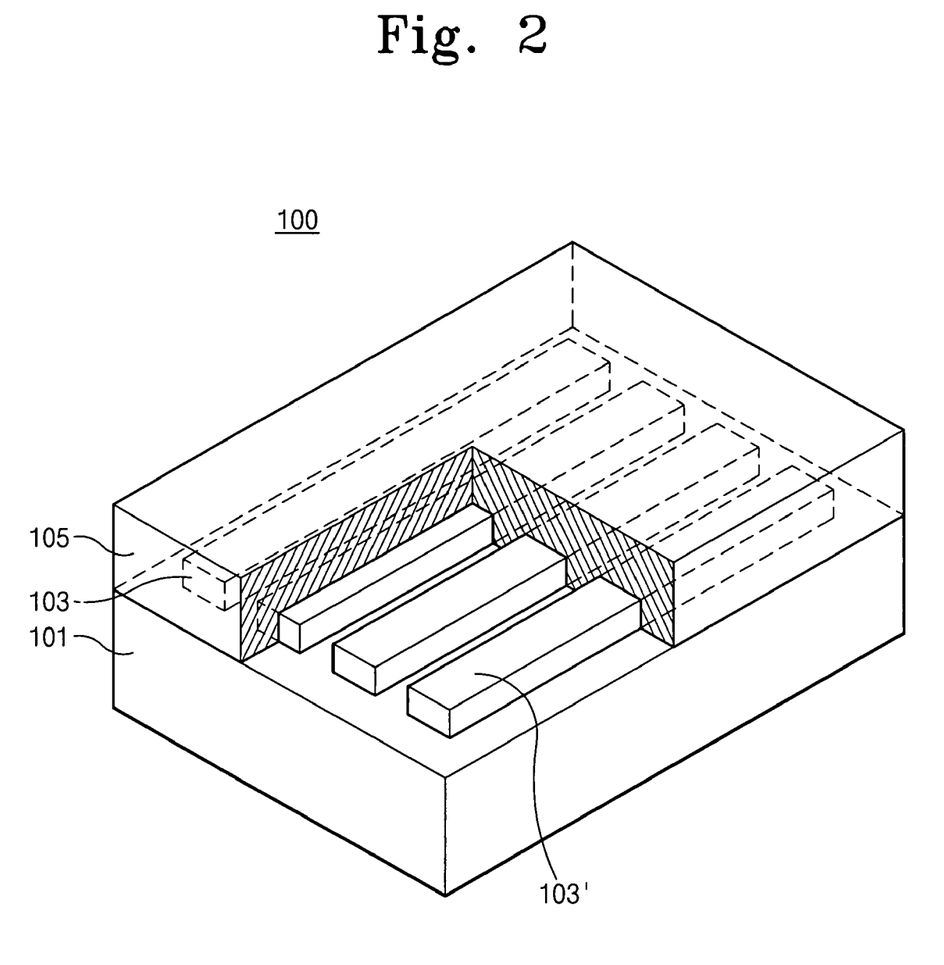
FIG. 2 is a schematic perspective view of a heterogeneous semiconductor substrate according to another embodiment of the present invention, wherein a part of the heterogeneous semiconductor substrate is removed to show its inner part.

The individual elements 103' of the second semiconductor pattern 103 may have various shapes that may, for example, be selected based on the desired electrical and/or mechanical properties of the device that is to be fabricated. Thus, for example, in FIG. 1, the second semiconductor pattern 103 includes rectangular shaped individual elements 103'. FIG. 2 depicts another exemplary embodiment of the present invention in which the individual elements 103' are line-shaped. It will be appreciated that numerous different shapes may be used, and that not all of the individual elements need have the same shape.

Figure 3:
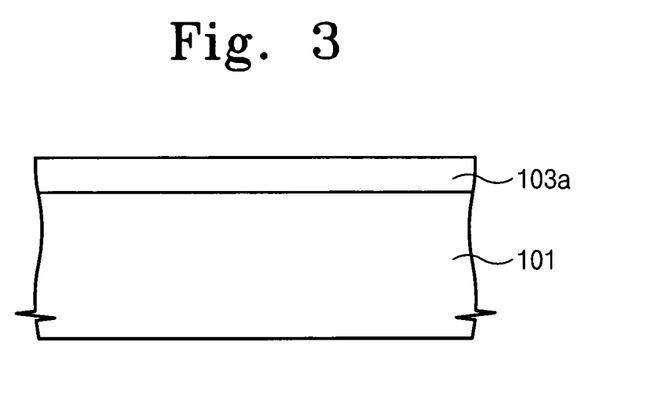
FIGS. 3-5 are cross-sectional views illustrating a method for forming the heterogeneous semiconductor substrate according to one embodiment of the present invention.

Hereinafter, an exemplary method of forming heterogeneous semiconductor substrates according to the first embodiment of the present invention will be described with reference to FIGS. 3-7. As shown in FIG. 3, a silicon-germanium epitaxial layer 103a is formed on a bulk silicon substrate 101 using an epitaxial growth technique. The epitaxial growth technique may be any conventional and/or non-conventional epitaxial growth technique such as, for example, vapor-phase epitaxy, molecular-beam epitaxy, chemical vapor deposition (CVD), sputtering, etc. The epitaxial growth technique may, for example, use $SiH_4$ as a source gas. In the exemplary case of FIG. 3 where a silicon-germanium epitaxial layer 103a is formed using a CVD method, the reaction temperature may be between about 400° C. and 1000° C. The silicon-germanium epitaxial layer 103a may be grown uniformly across the entire surface of the bulk silicon substrate 101.

Herein, references are made to growing various semiconductor layers "at" a certain temperature (e.g., "growing a first Group IV semiconductor layer at a first temperature" or "growing a first Group IV semiconductor layer at a temperature between about 300° C. and 800° C."). It will be understood that this language covers growing the semiconductor layer at a single temperature or at multiple temperatures, so long as the growth temperatures fall within any recited range. It will further be understood that the recited temperatures refer to the temperature of the environment (e.g., the inside of a reactor) in which the semiconductor layer is grown. It will also be understood that some amount of growth may also occur at temperatures that are below the lower limit of any recited range, as might occur when a reactor in which the growth occurs is being heated up to the growth temperature(s).

Figure 4:
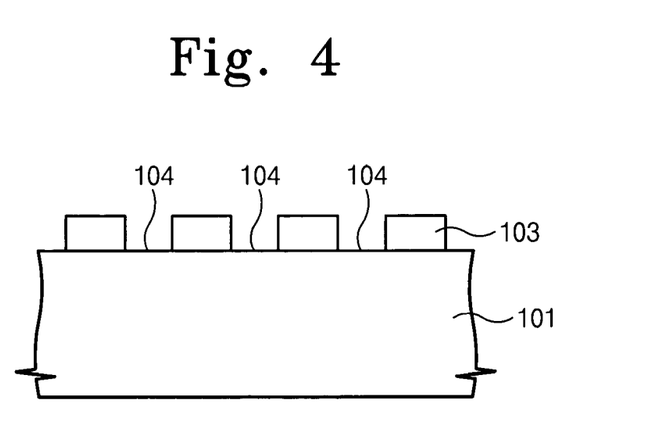

As shown in FIG. 4, a photolithography process may be performed on the silicon-germanium epitaxial layer 103a to form a silicon-germanium epitaxial pattern 103 that has a predetermined shape. As a result of this photolithography process, portions 104 of the bulk silicon substrate 101 are exposed. The silicon-germanium pattern 103 includes a lateral surface, an upper surface and a bottom surface that is in contact with the bulk silicon substrate 101. It will be appreciated that various other processes may be used to form the silicon-germanium epitaxial pattern 103.

Figure 5:
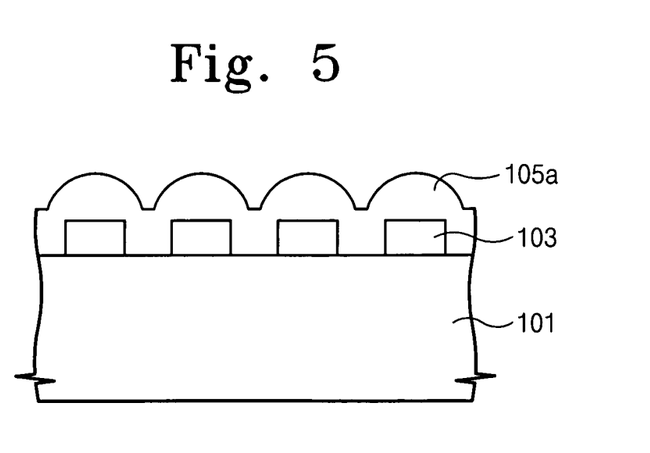

As shown in FIG. 5, a primary silicon epitaxial layer 105a may then be grown on the exposed portions of the bulk silicon substrate 101, and on the lateral surface and upper surfaces of the silicon-germanium epitaxial pattern 103. This primary silicon epitaxial later 105 may be grown, for example, using a conventional epitaxial growth technique. The growth of the primary silicon epitaxial later 105 may be performed at a temperature (typically a low temperature) which does not allow movement of the silicon or germanium that comprises the silicon-germanium expitaxial pattern 103, thereby maintaining the shape of the silicon-germanium pattern 103. The primary silicon epitaxial layer 105 may comprise a single crystalline epitaxial layer. As is also shown in FIG. 5, the upper surface of the primary silicon epitaxial layer 105a may follow the surface shape of the lower semiconductor layers 101, 103. In other words, the primary silicon expitaxial layer 105 may grow conformally on the topology of the bulk silicon substrate and the silicon-germanium pattern. The primary silicon epitaxial layer 105 may be grown, for example, at temperatures between about 300° C. and about 800° C. so that significant distortion to the silicon-germanium epitaxial pattern does not occur.

Figure 6:
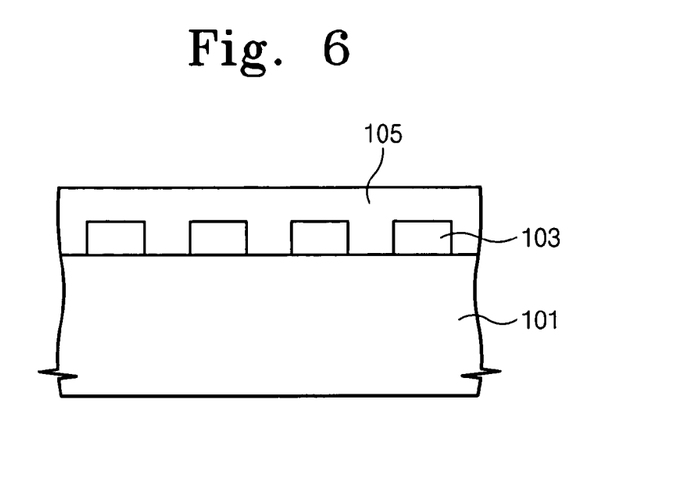
FIG. 6 is a cross-sectional view illustrating a method for forming the heterogeneous semiconductor substrate according to another embodiment of the present invention.

Next, as shown in FIG. 6, a thermal process may be performed in, for example, a hydrogen gas or an argon gas ambient, and a surface of the primary curved silicon epitaxial layer 105a is planarized. As a result, a silicon epitaxial layer 105 that has a flat upper surface may be formed. This thermal process may be performed at a high temperature (i.e., higher than the temperature used to grow the primary silicon epitaxial layer 105a) which can enable the silicon of the primary silicon epitaxial layer 105a to move, thereby allowing the formation of the silicon expitaxial layer 105 that has a flat upper surface. The movement of the silicon during a thermal process in a hydrogen ambient may result from continuous formation of silane from silicon and hydrogen ($Si + 2H_2 \rightarrow SiH_4$) and dissolution of silane to silicon and hydrogen ($SiH_4 \rightarrow Si + 2H_2$). Additionally, the silicon epitaxial layer typically will tend to flatten (i.e., form to a more stable state) at higher temperatures rather than remain in a curved (less stable) state. Since the silicon-germanium pattern 103 is protected by the primary silicon epitaxial layer 105a, significant surface movement of the silicon-germanium does not occur during this subsequent thermal process. Therefore, the shape of the silicon-germanium pattern 103 may be maintained.

The temperature of the above-described thermal process that is performed in a hydrogen gas ambient may, for example, be between about 600° C. and about 1200° C. The temperature of thermal process when an argon gas ambient is used instead may, for example, be between about 900° C. and about 1200° C. Since not only thermal energy, but also the hydrogen gas itself, can act to planarize the upper surface of the primary epitaxial layer 105 when the thermal process is conducted in a hydrogen gas ambient, it may be possible to perform the planarization process at lower temperatures when a hydrogen gas ambient is used (as compared to, for example, an argon gas ambient).

Thus, in accordance with the first embodiment of the present invention, an epitaxial layer having a flat upper portion may be formed on a curved lower surface through a two step process comprising an epitaxial growth at a low temperature and a thermal process at a higher temperature.

Figure 7:
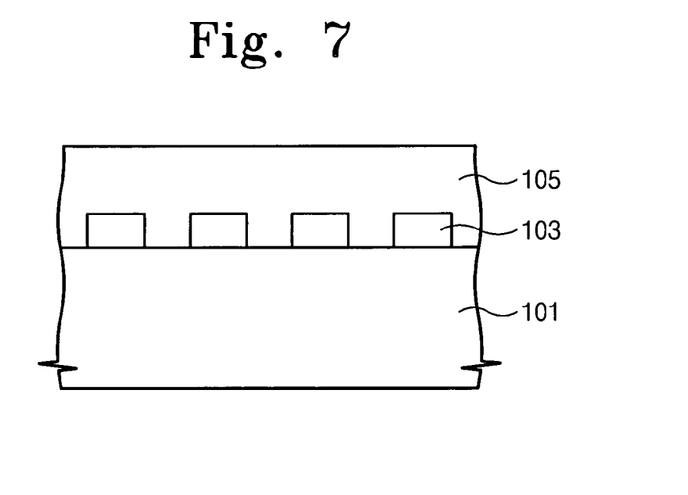
FIGS. 7-11 are cross-sectional views illustrating a method for fabricating a semiconductor device according to embodiments of the present invention using the heterogeneous semiconductor substrate of FIG. 2.

According to further embodiments of the present invention, an epitaxial layer having a flat upper portion can be formed on a curved lower surface through two epitaxial growth steps as described hereinafter. In particular, after growing the primary silicon epitaxial layer 105a of FIG. 5 using a low temperature growth step, an additional secondary epitaxial growth is performed at a higher temperature. As a result, as shown in FIG. 7, a secondary epitaxial layer 105 having a flat surface may be formed. Since the secondary epitaxial growth is performed at a (high) temperature where surface movement can occur, the curve-shaped profile of the primary epitaxial layer 105a may gradually be flattened. Therefore, an upper surface of the secondary silicon epitaxial layer 105 is planarized. Moreover, since the silicon-germanium pattern 103 is already protected by the primary silicon epitaxial layer 105a, the shape of the silicon-germanium pattern 103 may avoid significant distortion during the secondary epitaxial growth process. The temperature of the secondary epitaxial growth may, for example, be between about 600° C. and about 1200° C.

Figure 8:
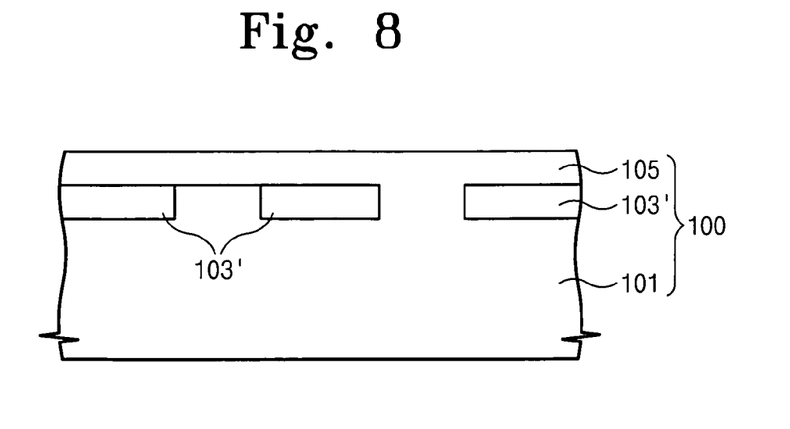

An exemplary embodiment of the present invention for forming a semiconductor device and/or an integrated circuit on a heterogeneous semiconductor substrate according to the above-mentioned method will now be described with reference to FIGS. 8-11. FIG. 8 shows the heterogeneous semiconductor substrate 100 formed by the above-mentioned method. As shown in FIG. 8, the heterogeneous semiconductor substrate 100 includes a bulk silicon substrate 101, a silicon-germanium pattern 103, and a silicon epitaxial layer 105. In this exemplary case, the individual elements 103' of the silicon-germanium pattern 103 are line-shaped.

Figure 9:
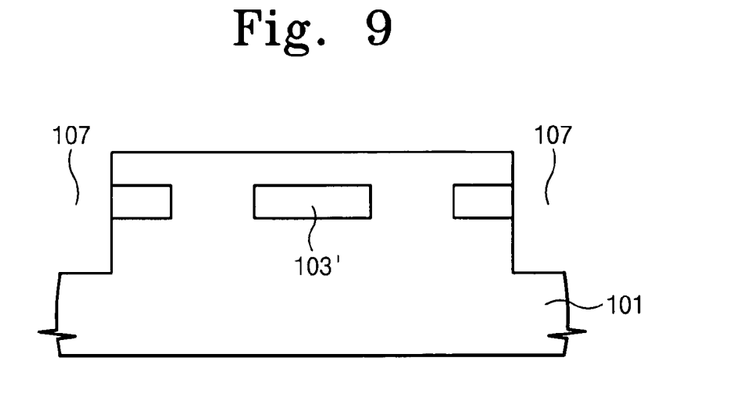

After preparing the heterogeneous semiconductor substrate 100, a device isolation process is performed. In particular, as shown in FIG. 9, a part of the heterogeneous semiconductor substrate 100 may be etched to form a trench 107 for isolating a device. In this case, the silicon epitaxial layer 105, the silicon-germanium epitaxial pattern 103, and the bulk silicon substrate are all etched as part of this isolation process.

Figure 10:
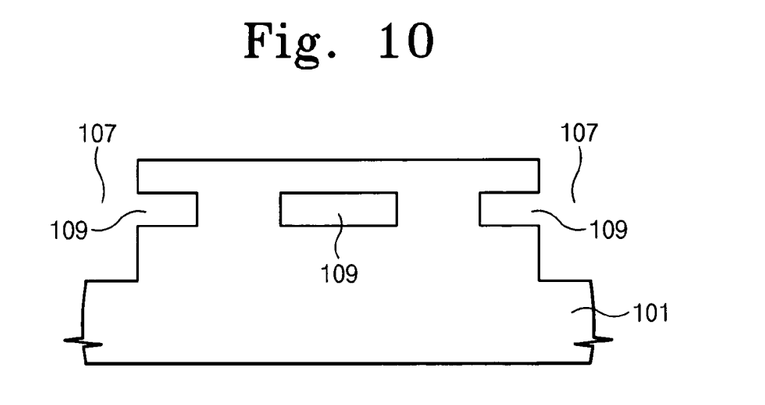

Next, as shown in FIG. 10, the exposed silicon-germanium epitaxial pattern 103 is selectively removed, leaving empty spaces 109. The empty spaces 109 may be filled with insulating material for use in the formation of a device isolation region.

Figure 11:
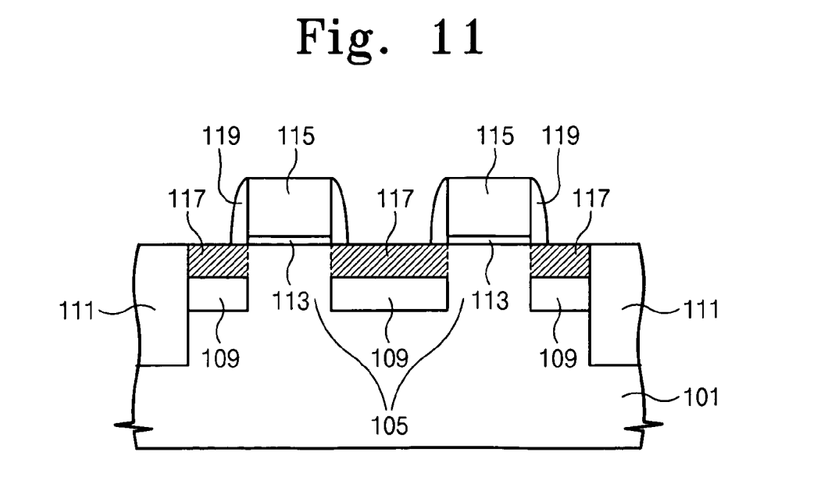

Next, as shown in FIG. 11, the trench 107 is filled with insulating materials to form a device isolation region 111. In specific embodiments of the present invention, this step may also be used to fill the empty spaces 109 with insulating materials. A thermal process can be performed before filling the trench 107 with insulating materials in order to form a silicon nitride layer which may act as an oxide barrier layer.

Next, as is also shown in FIG. 11, a gate oxide layer 113 may be formed, and a gate electrode 115 may be formed on the gate oxide layer 113. The gate electrode 115 may be formed on a portion of silicon epitaxial layer 105 that is between the empty spaces 109. The silicon epitaxial layer 105 under the gate electrode 115 functions as a channel region. Moreover, as shown in FIG. 11, the silicon epitaxial layer 105 under the gate electrode 115 is connected to the bulk silicon substrate 101, thereby avoiding the floating-body effect that may occur when a conventional SOI substrate is used.

After forming the gate electrode 115, source/drain regions 117 may be formed on the silicon epitaxial layer at both sides of the gate electrode 115 using, for example, an ion implantation process. Additionally, spacers 119 may be formed on the sidewalls of the gate electrode 115. As shown in FIG. 11, there is an empty space 109 (which, as discussed above, may be filled with an insulating material) under the silicon epitaxial layer on both sides of the gate electrode 115. As a result, punch-through is suppressed, and the junction parasitic capacitance may be reduced.

As is also shown in FIG. 11, each source/drain region 117 overlaps one of the empty spaces 109 (or any insulating material which is used to fill such empty spaces). By "overlap" it is meant that an axis exists which is perpendicular to the primary plane of the heterogeneous substrate 100 that bisects both the empty space 109 (or any insulating material which is used to fill such empty spaces) and the source/drain region 117.

In the meanwhile, the gate electrode 115 may be formed over the empty space 109. In this case, the source/drain regions are connected to the bulk silicon substrate with each other.

When the heterogeneous semiconductor substrates according to embodiments of the present invention are used in a conventional semiconductor manufacturing process, it may be possible to avoid problems such as the floating body effect that may arise when SOI techniques are used. By way of example, in integrated circuits in which the channel and source/drain regions for transistors are formed in the epitaxial silicon layer, the floating body effect and/or the accumulation of hot electrons can be reduced or minimized since the epitaxial silicon layer (i.e., the third semiconductor layer) is connected to the silicon substrate (i.e., the first semiconductor layer). Additionally, a back-bias voltage can be applied to the first semiconductor layer, so that the electric potential of source (drain) regions can be maintained at the same value throughout the wafer. This may facilitate providing transistors having a relatively constant threshold voltage. Furthermore, if the silicon-germanium epitaxial layer pattern (second semiconductor layer) is located under the source/drain regions and removed during the manufacturing process, it is possible to reduce and/or minimize junction leakage current between the source/drain regions and the substrate, and it may also facilitate controlling the depth of the source/drain regions.

In the drawings and specification, there have been disclosed typical embodiments of the invention and, although specific terms are employed, they are used in a generic and descriptive sense only and not for purposes of limitation, the scope of the invention being set forth in the following claims.

What is claimed is:

1. A method of forming a heterogeneous semiconductor substrate comprising:

forming a second semiconductor pattern having a planar upper surface on a planar upper surface of a first semiconductor layer; and forming a third semiconductor layer having a planar upper surface on the planar upper surface of the second semiconductor pattern and on the planar upper surfaces of a plurality of exposed portions of the first semiconductor layer to provide the heterogeneous semiconductor substrate, wherein forming the third semiconductor layer having the planar upper surface comprises:

growing a primary epitaxial layer on the planar upper surface of the second semiconductor pattern and on the planar upper surfaces of the plurality of exposed portions of the first semiconductor layer at a first temperature such that a surface movement of the second semiconductor pattern does not occur; and forming a secondary epitaxial layer having a planar upper surface at a second temperature such that a surface movement of the primary epitaxial layer occurs.

2. The method of claim 1, wherein the first temperature is between about 300° C. and about 800° C., and the second temperature is between about 800° C. and about 1200° C.

3. A method of forming a heterogeneous semiconductor substrate comprising:
   forming a second semiconductor pattern having a planar upper surface on a planar upper surface of a first semiconductor layer; and
   forming a third semiconductor layer having a planar upper surface on the planar upper surface of the second semiconductor pattern and on the planar upper surfaces of a plurality of exposed portions of the first semiconductor layer to provide the heterogeneous semiconductor substrate,
   wherein forming the third semiconductor layer having the planar upper surface comprises:
   growing a epitaxial layer on the planar upper surface of the second semiconductor pattern and on the planar upper surfaces of the plurality of exposed portions of the first semiconductor layer at a first temperature such that a surface movement of the second semiconductor pattern does not occur; and
   planarizing the upper surface of the epitaxial layer by performing a thermal process at a second temperature such that a surface movement of the epitaxial layer occurs.

4. The method of claim 3, wherein the first temperature is between about 300° C. and about 800° C. the second temperature is between about 600° C. and about 1200° C.; and
   wherein the thermal process is performed in a hydrogen gas ambient.

5. The method of claim 3, wherein the first temperature is between about 300° C. and about 800° C., the second temperature is between about 900° C. and 1200° C.; and
   wherein the thermal process is performed in an argon gas ambient.

6. A method of forming a heterogeneous semiconductor substrate comprising:
   forming a second semiconductor pattern having a planar upper surface on a planar upper surface of a first semiconductor layer; and
   forming a third semiconductor layer having a planar upper surface on the planar upper surface of the second semiconductor pattern and on the planar upper surfaces of a plurality of exposed portions of the first semiconductor layer to provide the heterogeneous semiconductor substrate,
   wherein the first semiconductor layer is a single crystalline silicon substrate, and
   wherein forming the second semiconductor pattern comprises growing a silicon-germanium epitaxial layer on the single crystalline silicon substrate and patterning the silicon-germanium expitaxial layer,
   wherein forming the third semiconductor layer comprises growing a silicon epitaxial layer on surfaces of the single crystalline silicon substrate and the silicon-germanium epitaxial layer, and
   wherein forming the third semiconductor layer further comprises:
   growing the silicon epitaxial layer at a first temperature such that a surface movement of the patterned silicon-germanium epitaxial layer does not occur; and
   forming a secondary silicon epitaxial layer having a planar upper surface on the silicon epitaxial layer at a second temperature that is higher then the first temperature such that a surface movement of the silicon epitaxial layer occurs.

7. The method of claim 6, wherein the first temperature is between about 300° C. and about 800° C., and the second temperature is between about 800° C. and about 1200° C.

8. A method of forming a heterogeneous semiconductor substrate comprising:
   forming a second semiconductor pattern having a planar upper surface on a planar upper surface of a first semiconductor layer; and
   forming a third semiconductor layer having a planar upper surface on the planar upper surface of the second semiconductor pattern and on the planar upper surfaces of a plurality of exposed portions of the first semiconductor layer to provide the heterogeneous semiconductor substrate,
   wherein the first semiconductor layer is a single crystalline silicon substrate, and
   wherein forming the second semiconductor pattern comprises growing a silicon-germanium epitaxial layer on the single ciystalline silicon substrate and patterning the silicon-germanium epitaxial layer,
   wherein forming the third semiconductor layer comprises growing a silicon epitaxial layer on surfaces of the single crystalline silicon substrate and the silicon-germanium epitaxial layer, and
   wherein forming the third semiconductor layer further comprises:
   growing the silicon epitaxial layer at a first temperature such that a surface movement of the patterned silicon-germanium epitaxial layer does not occur; and
   planarizing the upper surface of the silicon epitaxial layer by performing a thermal process at a second temperature that is higher then the first temperature such that a surface movement of the silicon epitaxial layer occurs.

9. The method of claim 8, wherein the first temperature is between about 300° C. and about 800° C., the second temperature is between about 600° C. and about 1200° C.

10. A method of forming an integrated circuit, comprising:
    forming a second semiconductor pattern on a first semiconductor layer; and
    forming a third-semiconductor layer on a planar upper surface of the second semiconductor pattern and on a plurality of exposed portions of the first semiconductor layer, the third semiconductor layer having a planar upper surface and a level of the upper surface of the portions of the third semiconductor layer that are on the second semiconductor pattern being substantially the same height as a level of the upper surface of the portions of the third semiconductor layer that are on the first semiconductor layer to provide a heterogeneous substrate;
    forming at least one semiconductor device on the heterogeneous substrate; and
    prior to forming the at least one semiconductor device, selectively removing at least portions of the second semiconductor pattern to provide a plurality of voids within the heterogeneous substrate.

11. A method of forming an integrated circuit, comprising:
    forming a second semiconductor pattern on a first semiconductor layer; and
    forming a third semiconductor layer on the second semiconductor pattern and on a plurality of exposed portions of the first semiconductor layer to provide a heterogeneous substrate;

forming at least one semiconductor device on the heterogeneous substrate; and prior to forming the at least one semiconductor device, selectively removing at least portions of the second semiconductor pattern to provide a plurality of voids within the heterogeneous substrate, wherein forming the third semiconductor layer comprises:

growing a primary epitaxial layer on the second semiconductor pattern and on the plurality of exposed portions of the first semiconductor layer at a first temperature such that a surface movement of the second semiconductor pattern does not occur; and forming a secondary epitaxial layer having a planar upper surface at a second temperature that is higher then the first temperature such that a surface movement of the primary epitaxial layer occurs.

12. The method of claim 11, further comprising at least partially filling at least some of the plurality of voids with an insulating material.

13. The method of claim 12, wherein the first semiconductor layer is a single crystalline silicon substrate, and wherein forming the second semiconductor pattern comprises growing a silicon-germanium epitaxial layer on the single crystalline silicon substrate and patterning the silicon-germanium expitaxial layer, and wherein forming the third semiconductor layer comprises growing a silicon epitaxial layer directly on surfaces of the single crystalline silicon substrate and on the silicon-germanium epitaxial layer.

14. The method of claim 11, wherein forming the at least one semiconductor device comprises forming a field effect transistor such that a source region overlaps a first of the plurality of voids with an insulating material and a drain region of the field effect transistor overlaps a second of the plurality of voids with an insulating material.

15. The method of claim 14, wherein the first and second of the plurality of voids with an insulating material are used to control the depth of the source region and the depth of the drain region, respectively.

16. A method of forming an integrated circuit, comprising:

forming a second semiconductor pattern on a first semiconductor layer; and forming a third semiconductor layer on the second semiconductor pattern and on a plurality of exposed portions of the first semiconductor layer to provide a heterogeneous substrate;

forming at least one semiconductor device on the heterogeneous substrate; and prior to forming the at least one semiconductor device, selectively removing at least portions of the second semiconductor pattern to provide a plurality of voids within the heterogeneous substrate, wherein forming the third semiconductor layer comprises:

growing a epitaxial layer on the second semiconductor pattern and on the plurality of exposed portions of the first semiconductor layer at a first temperature such that a surface movement of the second-semiconductor pattern does not occur; and planarizing the upper surface of the epitaxial layer by performing a thermal process at a second temperature that is higher then the first temperature such that a surface movement of the epitaxial layer occurs.

* * * * *